United States Patent
Tokuda (10) Patent No.: US 8,337,940 B2
(45) Date of Patent: Dec. 25, 2012

(54) MANUFACTURING METHOD OF DISPLAY DEVICE

(75) Inventor: Atsushi Tokuda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1328 days.

(21) Appl. No.: 11/525,821

(22) Filed: Sep. 25, 2006

(65) Prior Publication Data

US 2007/0054582 A1    Mar. 8, 2007

Related U.S. Application Data

(62) Division of application No. 10/736,543, filed on Dec. 17, 2003, now Pat. No. 7,112,113.

(30) Foreign Application Priority Data

Dec. 25, 2002 (JP) ................................. 2002-374155

(51) Int. Cl.
*B05D 5/06* (2006.01)

(52) U.S. Cl. .......................................... 427/66; 427/273

(58) Field of Classification Search .................... 427/66, 427/336, 273
See application file for complete search history.

(56) References Cited

U.S. PATENT DOCUMENTS

| | | | |
|---|---|---|---|
| 5,518,824 A | 5/1996 | Funhoff et al. | |
| 5,807,627 A | 9/1998 | Friend et al. | |
| 5,952,037 A | 9/1999 | Nagayama et al. | |
| 6,114,715 A | 9/2000 | Hamada | |
| 6,558,219 B1 | 5/2003 | Burroughes et al. | |
| 6,593,690 B1 | 7/2003 | McCormick et al. | |
| 6,706,551 B2 | 3/2004 | Andriessen | |
| 6,762,552 B1 | 7/2004 | Duineveld et al. | |
| 6,771,019 B1 | 8/2004 | Wu et al. | |
| 6,805,979 B2 | 10/2004 | Ogura et al. | |
| 6,841,266 B2 | 1/2005 | Chen et al. | |
| 7,112,113 B2 | 9/2006 | Tokuda | |
| 2001/0001050 A1* | 5/2001 | Miyashita et al. | 428/690 |
| 2001/0011868 A1* | 8/2001 | Fukunaga et al. | 313/506 |
| 2001/0017155 A1* | 8/2001 | Bellmann et al. | 136/263 |

(Continued)

FOREIGN PATENT DOCUMENTS

EP    1 058 314 A2    12/2000

(Continued)

OTHER PUBLICATIONS

Y. Yang and A.J. Heeger, "Polyaniline as a transparent electrode for polymer light-emitting diodes: Lower operating voltage and higher efficiency", Appl. Phys. Lett. 64 (10), Mar. 7, 1994, pp. 1245-1247.

(Continued)

*Primary Examiner* — James Lin
(74) *Attorney, Agent, or Firm* — Nixon Peabody LLP; Jeffrey L. Costellia (57) ABSTRACT

A method for manufacturing a display device of the present invention comprises the steps of forming insulating barriers which surround electrode and project upward from the surface of the electrode, and bringing the whole substrate into contact with water after applying the solution including an acceptor in wet process. According to the present invention, an organic conductive layer can be uniformly formed over a substrate in wet process even if the substrate does not have a smooth surface and has distribution in wettability of the surface.

24 Claims, 4 Drawing Sheets

U.S. PATENT DOCUMENTS

| | | | |
|---|---|---|---|
| 2001/0025959 A1* | 10/2001 | Yamazaki et al. | 257/72 |
| 2001/0053082 A1* | 12/2001 | Chipalkatti et al. | 362/496 |
| 2002/0063517 A1* | 5/2002 | Hosokawa | 313/504 |
| 2002/0096995 A1* | 7/2002 | Mishima et al. | 313/506 |
| 2002/0187567 A1* | 12/2002 | Yamazaki et al. | 438/11 |
| 2003/0025445 A1 | 2/2003 | Lee | |
| 2003/0042849 A1 | 3/2003 | Ogino | |
| 2003/0162314 A1* | 8/2003 | Yamazaki et al. | 438/46 |
| 2003/0180457 A1* | 9/2003 | Murakami et al. | 427/237 |
| 2003/0209973 A1 | 11/2003 | McCormick et al. | |
| 2005/0206313 A1 | 9/2005 | Yamazaki et al. | |
| 2005/0208863 A1 | 9/2005 | Yamazaki et al. | |
| 2007/0054582 A1 | 3/2007 | Tokuda | |

FOREIGN PATENT DOCUMENTS

| | | | |
|---|---|---|---|
| JP | 2001-217075 | | 8/2001 |
| JP | 2001-516939 A | | 10/2001 |
| JP | 2001-319777 | | 11/2001 |
| JP | 2002-110348 | | 4/2002 |
| JP | 2003-068457 | | 3/2003 |
| JP | 2003-509817 | | 3/2003 |
| JP | 2003-123986 | | 4/2003 |
| JP | 2004-047215 | | 2/2004 |
| WO | WO 99/13692 | | 3/1999 |
| WO | WO 01/18889 A1 | | 3/2001 |
| WO | WO 03-034513 | * | 4/2003 |
| WO | WO 2004/060025 A1 | | 7/2004 |

OTHER PUBLICATIONS

S.A. Carter et al., "Polymeric anodes for improved polymer light-emitting diode performance", Appl. Phys. Lett. 70 (16) Apr. 21, 1997, pp. 2067-2069.

International Search Report for Application No. PCT/JP03/16352; PCT6839 dated May 11, 2004.

International Preliminary Report for Application No. PCT/JP03/16352; PCT6839 dated Jun. 15, 2004 with partial English translation.

* cited by examiner

MANUFACTURING METHOD OF DISPLAY DEVICE

TECHNICAL FIELD

The present invention relates to a manufacturing method of a display device in which a display portion is formed from a light emitting element using an organic electroluminescent (hereinafter referred to as EL) material.

BACKGROUND ART

An display for displaying an image is one of essential information display mediums for modem life. The display for displaying an image is found as usage in several modes, such as starting from a so-called TV monitor, a liquid crystal display that has been rapidly developed recently, and an organic EL display that is expected the further development. Specifically, the liquid crystal display and the organic EL display are characterized by being able to drive in lower voltage, and are an important research and development issue in view of energy saving.

Above all, the organic EL display attracts most attention as a next generation flat panel display.

The emission mechanism of the light emitting element using an organic EL material used in the organic EL display is the mechanism of using a photon, in which a molecular exciton is formed with recombination of an electron injected from a cathode and a hole injected from an anode in the luminescent center of the electroluminescent film by being provided with a thin film (hereinafter referred to as an electroluminescent film) including a luminescent body between the electrodes and applying current to them, and then the photon is ejected when the molecular exciton returns to a ground.

Usually, the electroluminescent film is formed with a thin film having a film thickness of less than 1 μm. Further, the light emitting element using the organic EL material is a self-luminous type element in which electroluminescent film itself emits light, backlight used for the conventional liquid crystal display is not required. Therefore, it is a big advantage that the light emitting element can be manufactured extremely thinner and lighter.

As described above, the emission mechanism of the light emitting element using the organic EL material is the mechanism of using a photon, in which a molecular exciton is formed with recombination of an electron injected from a cathode and a hole injected from an anode in the luminescent center of the electroluminescent film by being provided with the electroluminescent between the electrodes and applying the current to them, and the photon is ejected when the molecular exciton returns to a ground. Therefore, it is one of requirements to efficiently inject the hole and the electron into the electroluminescent film for manufacturing an efficient light emitting element.

As a typical operation condition of the light emitting element using an organic EL material, current of approximately 100 $mA/cm^2$ is applied to the electroluminescent film with originally higher electrical resistance. In order to realize the current injection having such a higher density, a hole injection barrier from the anode and an electron injection barrier from the cathode are to be reduced as far as possible. Namely, a metal with a smaller work function is to be used as the cathode; on the other hand, a metal with larger work function is to be used as the anode. As for the cathode, the work function can be practically controlled voluntarily by selecting various metal or alloy. On the contrary, the transparency is required for the anode in the light emitting element using the general organic EL material, the material for the light emitting element is limited to the transparent conductive oxide as it now stands. Considering the stability, the transparency and the resistivity, several oxide conductive films typified by indium-tin oxide (hereinafter referred to as ITO) must be selected for the anode.

The ITO electrode is the one doped (added) with tin into the indium oxide, and the tin gets into the substitution site of indium. The tin and the some oxygen defect become the donor, and conductivity is developed by partly filling the conductive band. The ITO is formed over a glass by sputtering, ion beam sputtering, vapor growth method, or the like. The lower resistance electrode with higher transparency can be manufactured by choosing the adequate amount of tin doping.

However, because the surface of the ITO film is not always flattened, it is pointed out that the contact with an electroluminescent film used for the light emitting element using the organic EL material is deteriorated or a pin hole is generated in the electroluminescent film. And it is said that is a reason of the deterioration of the light emitting element using the organic EL material. Further, the work function of the ITO film can be varied to some extent according to record in the film formation or the surface treatment, however the technique thereof is limited. Consequently, the reduction of the hole injection barrier is prevented.

As a method for reducing the hole injection barrier from ITO film as the anode, the technique to deposit a buffer layer over the ITO film is known. To make the adequate ionization potential of the buffer layer, the hole injection barrier can be reduced. The buffer layer is referred to as a hole injection layer. A substance that functions as the hole injection layer can be roughly categorized by metal oxide, low molecular organic compound, and high molecular compound. A conjugated polymer such as polyaniline (refer to non-patent literature 1) and polythiophene derivative (refer to non-patent literature 2) are known as the high molecular compound material. The conjugated polymer such as the polyaniline and the polythiophene rarely has conductivity by itself. And by mixing with strong acid such as camphor sulfonic acid and poly (styrenesulfonic acid) as acceptor, namely by doping, higher conductivity is developed. Accordingly, the conductive conjugated polymer which has been doped functions as the hole injection material.

(Non-patent reference. 1)
Y. Yang et al., Applied physics letters, Vol. 64, 1245 page, 1994

(Non-patent reference. 2)
S. A. Carter et al., Applied physics letters, Vol. 70, 2067 page, 1987

By using the conductive conjugated polymer which has been doped as the hole injection layer, the hole injection barrier is reduced and the hole can be efficiently injected. As a result, the efficiency and the lifetime of the light emitting element using the organic EL material can be improved, and the drive voltage can be reduced. The conductivity conjugated polymer is characterized by being able to be formed over the ITO surface in wet application method or ink-jetting.

A method of obtaining hydrophilic property of the substrate by using UV ozone rinsing or oxygen plasma rinsing is widely conducted so that the conductive conjugated polymer is uniformity formed in wet process against the substrate surface having the ITO.

DISCLOSURE OF INVENTION

Problem to be Solved by the Invention

In the case of manufacturing an organic EL display wherein each pixel is formed from a light emitting element using an plurality of organic EL material, there is a problem that even an organic conductive layer is to be formed over a substrate having a pixel electrode (ITO or the like) corresponding to the each pixel as described above, an uniform layer is not able to be obtained. The substrate, specifically the substrate mounted with a thin film transistor (hereinafter referred to as a TFT) is provided with a barrier having electric isolation so as to isolate each pixel electrode, thus surface smoothness becomes worse, and distribution in wettability of a substrate surface is occurred.

The wettability of the substrate is evaluated by measuring a contact angle of a droplet which is dropped to the substrate surface. When liquid is dropped on the solid surface, the droplet is formed on the solid surface. An angle formed by the liquid surface and the solid surface is referred to as a contact angle θ (Contact Angle θ). And such a phenomenon of the liquid and solid is referred to as Wetting.

In the case where there is distribution in the wettability of the substrate, soon after a conductive conjugated polymer is applied, the applied solution coheres to the place having higher wettability when the applied solution is water-soluble. There is a case where unevenness caused at this time is not dissolved by spinning; therefore an even thin film can not be obtained.

Accordingly, an object of the present invention is to provide a manufacturing method in which an organic conductive layer comprising dopant can be formed uniformly to the substrate over which the organic conductive layer can not be uniformly formed.

A Means for Solving Problem

The present invention comprises a method for manufacturing a display device comprising the steps of: forming plurality of first electrodes corresponding to plurality of pixels arranged in matrix over an insulating surface of a substrate; forming insulating barriers which surround the first electrode and project upward from the surface of the first electrode; forming an organic conductive layer comprising an acceptor over the insulating barriers and the first electrode; forming an electroluminescent layer comprising an organic compound which is capable of emitting electroluminescent light over the organic conductive layer; and forming a second electrode over the electroluminescent layer, wherein a step of forming the organic conductive layer comprises: a first step of applying a solution or a dispersion liquid which includes the same substance as the acceptor in wet process; a second step of bringing the substrate into contact with water; and a third step of applying a solution or a dispersion liquid including a substance for constituting the organic conductive layer in wet process.

As described above, by performing the first and the second steps before the step of applying the solution or the dispersion liquid including the substance for constituting the organic conductive layer in wet process (the third step as described), the organic conductive layer can be uniformly formed in wet process even if the substrate does not have a smooth surface and has distribution in wettability of the surface.

Further, in terms of wettability in the first step, an organic compound having sulfonic acid group is preferably used for the acceptor.

In addition, the concentration of the solution or the dispersion liquid for the acceptor is preferably at least 1 wt % and at most 5 wt % in the first step.

In a manufacturing method of a display device according to the present invention described above, the organic conductive layer is formed in wet application method. Therefore, in the case of using a substance that a high molecular compound is doped with an acceptor as the organic conductive layer, the present invention is especially effective.

The present invention comprises a method for manufacturing a display device comprising the steps of: forming plurality of first electrodes corresponding to plurality of pixels arranged in matrix over an insulating surface of a substrate; forming insulating barriers which surround the first electrode and project upward from the surface of the first electrode; forming an organic conductive layer comprising a donor over the insulating barriers and the first electrode; forming an electroluminescent layer comprising an organic compound which is capable of emitting electroluminescent light over the organic conductive layer; and forming a second electrode over the electroluminescent layer, wherein a step of forming the organic conductive layer comprises; a first step of applying a solution or a dispersion liquid which includes the same substance as the donor in wet process; and a second step of applying a solution or a dispersion liquid including a substance for constituting the organic conductive layer in wet process.

As described above, by performing the first step before the step of applying the solution or the dispersion liquid of the substance for constituting the organic conductive layer in wet process (the second step as described), the organic conductive layer can be uniformly formed in wet process even if the substrate does not have a smooth surface and has distribution in wettability of the surface.

Further, the concentration of the solution or dispersion liquid for the donor is preferably at least 1 wt % and at most 5 wt % in the first step.

The organic conductive layer is formed in wet application method in a manufacturing method of a display device according to the present invention described above. Therefore, in the case of using a substance that donor is doped with the high molecular compound, the present invention is especially effective.

The present invention is specifically effective in a method for manufacturing an active matrix type display device.

Accordingly, in the present invention, the step of forming the first electrode further comprises a step of forming a data signal line, a scanning signal line, a nonlinear element connected to the data signal line, the scanning signal line, and the first electrode. At this time, the nonlinear element preferably comprises combination of a thin film transistor and a capacitor which are connected each other, or combination of a thin film transistor and a parasitic capacitor of the thin film transistor.

An Effect of the Invention

According to a manufacturing method of the present invention, an organic conductive layer can be uniformly formed by a simple method. Thus, a display device comprising a light emitting element using an organic EL material can be manufactured with preferable yield and lower cost.

BEST MODE FOR CARRYING OUT THE INVENTION

Embodiment Mode 1

A schematic diagram of a method for manufacturing a display device of the present invention is shown in FIGS. 1(A) to 1(F) in the order corresponding to the steps while showing the cross sections. In FIG. 1(A), the one provided with a first electrode 102 on a substrate 101 and an insulating barrier 103 for surrounding the first electrode 102 is shown.

FIG. 1(B) shows a cross sectional view when the solution including an acceptor is applied over the substrate 101 in wet process as a first step. A solution layer 104 comprising the acceptor is formed on the first electrode 102 and the insulating barrier 103.

As for the acceptor, an organic compound having sulfonic acid group is preferable. For example, poly (styrenesulfonic acid) is given as an example, and further, aqueous solution is preferable for the solution including the acceptor.

Then, a cross sectional view after water is brought into contact over the substrate 101 as a second step is shown in FIG. 1(C).

As a third step, a cross sectional view when a solution or a dispersion liquid including a substance which constitutes the organic conductive layer is applied over the substrate 101 in wet process and an organic conductive layer 105 is formed, is shown in FIG. 1(D).

As described, by performing the first and the second steps, the organic conductive layer 105 can be applied uniformly over the substrate having uneven wettability in wet process in the third step. That is because, for example, in the case that the organic compound having sulfonic acid group is used as an acceptor, both of hydrophilic group having sulfonic acid group and hydrophobic group having organic group are included therein, wettability of the insulating barrier surface is thought to be further improved.

Even more particularly, because of strong electron acceptability of an acceptor, the both surfaces of the first electrode 102 and the insulating barrier 103 are oxidized and the condition of the surfaces as for the wettability are reformed in a similar condition. The present inventor considers that this phenomenon is generated not only for the organic compound having sulfonic acid group but also for the substance having electron acceptability. Therefore, in FIG. 1(C), the condition where the layer 104 of the solution including acceptor is remained after the second step is illustrated, considering the above reason, the layer 104 of the solution including the acceptor is not necessary remained. That is to say, even the solution including an acceptor is entirely washed away by water during the second step, it is only necessary to reform the surface by the acceptor.

FIG. 1(E) is a cross sectional view when an electroluminescent layer 106 is formed on the organic conductive layer 105 after the above described steps. The electroluminescent layer 106 is formed by deposition or application in a wet process. As the composition of the electroluminescent layer 106, the structure of the light emitting element using the known organic EL material is preferably used.

FIG. 1(F) shows a cross sectional view when a second electrode 107 is formed on the electroluminescent layer 106. As the second electrode 107, a metal (for example, AlLi alloy, MgAg alloy, or the like) which is to be an electrode is formed by vacuum vapor deposition or EB method and further, either the first electrode or the second electrode is to have visible light transmissivity.

Figure 1:
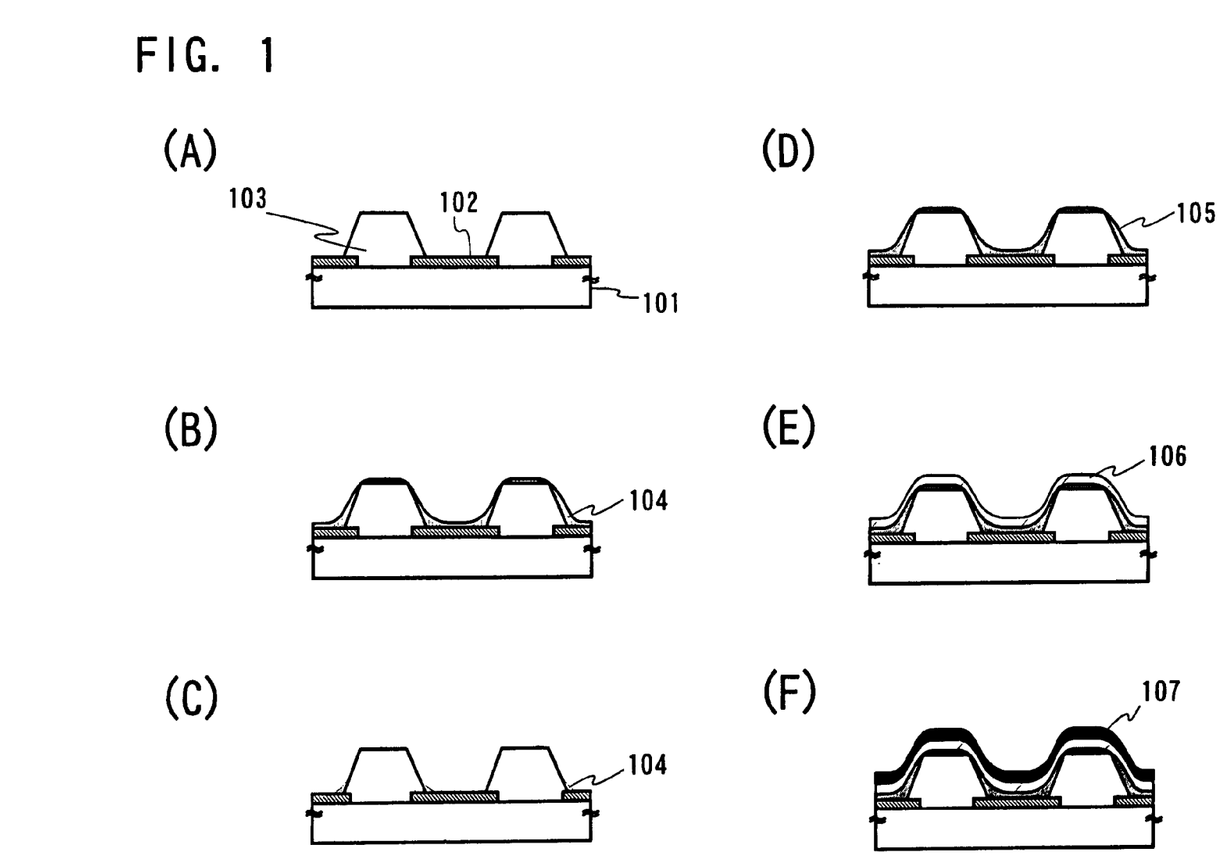
FIGS. 1(A) through 1(F) are diagrams showing images of the present invention.
Figure 2:
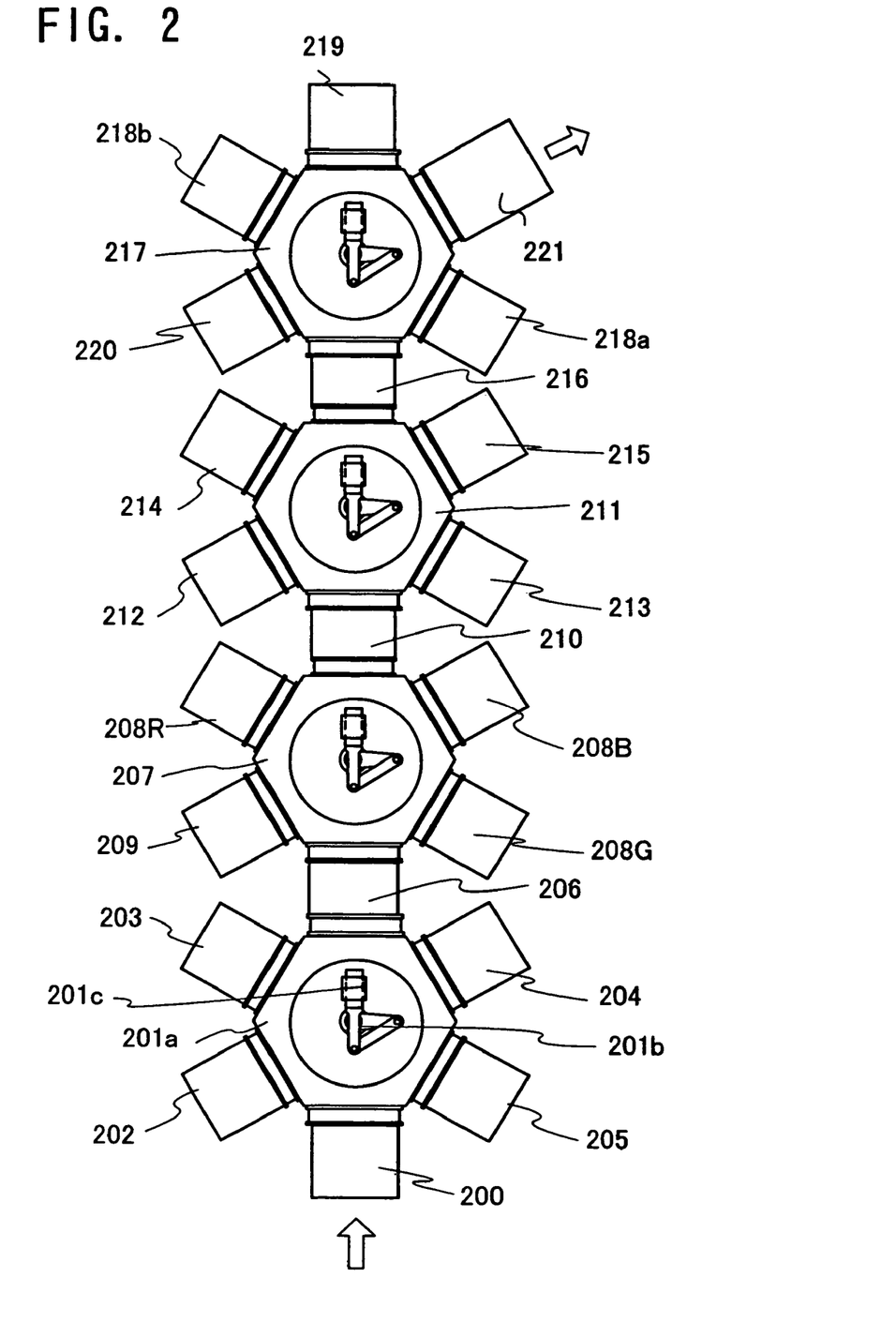
FIG. 2 is a diagram showing a system used in an embodiment of the present invention.

FIG. 2 shows a schematic diagram of a manufacturing apparatus of a light emitting element using an organic EL material according to the manufacturing method shown in FIG. 1. Hereinafter, an example of forming an electroluminescent layer by vacuum vapor deposition is illustrated. The apparatus is mainly configured of a transfer chamber for transferring substrates, a delivery chamber for delivery, a deposition chamber for depositing various thin films, and a sealing chamber for sealing. Each chamber is equipped with an exhaust apparatus for achieving necessary vacuum degree or a apparatus for generating a gas atmosphere such as $N_2$. In addition, the chambers are connected each other by a gate valve, and the like. The substrates are transferred by a transfer robot.

A substrate 201c (it is assumed that a pixel portion, a drive circuit portion, a wiring, an electrode, a protective film, and the like are incorporated over the substrate in advance) is introduced into a chamber 200 from external. Typically, a TFT is used in the pixel portion and the drive circuit portion. The substrate is set so that the surface thereof is turned up.

The chamber 200 into which the substrate 201c is introduced repeats exhausting and venting so as to obtain nitrogen atmosphere. The substrate 201c introduced into the chamber 200 is transferred to a transfer chamber 201a in normal pressure (nitrogen atmosphere) by a transfer robot 201b, and then transferred to a UV treatment chamber 203. In the UV treatment chamber 203, UV ozone treatment is performed toward the substrate 201c. This UV ozone treatment is performed for improving the wettability of the substrate.

The substrate that has done the UV ozone treatment is transferred into a coating chamber 204 through the transfer chamber 201a. In the coating chamber 204 in normal pressure (nitrogen atmosphere), an organic conductive layer, specifically, an conductive polymer including the acceptor such as (ethylenedioxy thiophene)/poly (styrenesulfonic acid) aqueous solution (hereinafter referred to as "PEDOT/PSS") is applied in wet process. There is a case that, the conductive polymer including the acceptor such as PEDOT/PSS can not be uniformly formed over the substrate only by UV ozone treatment. For that reason, the solution or the dispersion liquid including the same substance as the acceptor is applied in wet process. Specifically, aqueous solution including poly (styrenesulfonic acid) that is an acceptor is spin coated. After spin coating, the substrate is treated with pure water, then PEDOT/PSS is spin coated at the last. After the coating process, the substrate is transferred into an inversion and vacuum bake chamber 202 through the transfer chamber 201a. Here, inversion and vacuum bake of the substrate is carried out.

The substrate 201c is transferred to a delivery chamber 206 after vacuum baking. After delivery chamber 206 is exhausted and evacuated, the substrate 201c is transferred to a transfer chamber 207 kept in a regular vacuum. The transfer chamber 207 is also installed with a transfer robot which serves to transfer substrates to each of the chambers. Deposition chambers for forming the electroluminescent layer are connected to the transfer chamber 207. In consideration of manufacturing a OLED display device of full color display, deposition chambers 208R, 208G and 208B for forming light emitting layers of red, green and blue, and a deposition chamber 209 for forming common layers for each color, that is, a carrier transporting layer and a carrier injection layer and the like are installed. In these deposition chambers, vacuum vapor deposition is used in general. In order to obtain full color emission, a shadow mask for separately applying colors may be used in vapor deposition so as to arrange the light emitting layers showing emissions of red, green and blue colors respectively in stripes, mosaics or delta shapes.

The substrate over which film formation of the electroluminescent layer has done is transferred to a transfer chamber 211 through a delivery chamber 210. A transfer robot is also installed in the transfer chamber 211 and serves to transport substrates to each of the chambers connected to the transfer chamber 211. In a deposition chamber 212 or 213, a metal (for example, AlLi alloy, MgAg alloy, or the like) which is to be an electrode is deposited by vacuum vapor deposition or EB method. In an oxygen plasma chamber 214, an organic conductive layer that is adhered to an end face or range margin of the substrate, terminal portion, and a connection region of the cathode and the wiring in the lower part is eliminated. Before performing the oxygen plasma process, a metal to be the electrode by the vacuum vapor deposition or EB method can be deposited to the region where the organic conductive layer is to be remained. After the oxygen plasma process, the metal to be electrode is again formed so as to have a contact with the cathode. In a deposition chamber 215, a passivation film (for example, SiN, SiOx film or the like) for surface protection is deposited generally by sputtering or CVD process.

The substrate over which film formation has done is transported to a transfer chamber 217 through a delivery chamber 216. The transfer chamber 217 is also connected with a plurality of chambers required for sealing. In the transfer chamber 217, the transfer robot is also installed, which serves to transport substrates or sealing substrates to each chamber connected to the transfer chamber 217.

At first, there is a necessity to prepare a substrate for sealing. For this purpose, a sealing glass substrate preparation chamber 218a and a sealing plastic substrate 218b are provided.

In the sealing glass substrate preparation chamber 218a, a counter glass is introduced from the outside in order to carry out glass-seal to the fabricated OLED. If necessary, a desiccant for preventing the OLED from moisture can be introduced to the counter glass. For example, a sheet-formed desiccant may be sealed to a shaved-off part previously formed in the counter glass by a double-sided tape or the like.

On the other hand, in the sealing plastic substrate preparation chamber 218b, preparation is made for plastic-seal to the fabricated OLED. The operation may be fully automated, or partially manually operated by setting up gloves.

The prepared seal glass substrate or seal plastic substrate is transported to a dispenser chamber 219; an adhesive (not shown) for sealing the substrate is applied later. This embodiment mode uses a UV curing type as the adhesive. If necessary, the desiccant for preventing the OLED from water (not shown) may be reserved not within the seal glass substrate preparation chamber 218a during placing a glass but within the dispenser chamber 219. For example, a sheet-formed desiccant can be sealed on a previously formed shaved-off part of a counter glass by a double-sided tape or the like. This eliminates the necessity to handle the desiccant in the air. The operation may be fully automated, or partly manually operated by setting up gloves. Particularly, in the case where the seal plastic substrate has curvature and elasticity, the adhesive may be applied to the substrate in a curved state or in a straightly stretched state.

The substrate completed the deposition, the seal glass substrate or the seal plastic substrate applied with the adhesive are transported into a sealing and UV irradiation chamber 220, and then bonded together. During bonding, there is necessity to apply pressure by the use of a suitable jig (not shown). In the case of the seal plastic substrate having curvature and elasticity, the adhesive may be applied to the substrate in a straightly stretched state. The operation may be fully automated, or partly manually operated by setting up gloves.

Then, the substrates that are bonded together in the sealing and UV irradiation chamber 220 are irradiated with UV ray to cure the adhesive.

The substrate and the seal substrate that are bonded together in the sealing and UV irradiation chamber 220 may be drawn from a delivery chamber 221 to the outside.

Next, an example where the electroluminescent layer is formed in wet process is illustrated below. The process until forming the organic conductive layer and baking is carried out as the same method as described above. The substrate that is baked in the inversion and bake chamber 202 is transferred into a coating chamber 205 through the transfer chamber 201a while setting the substrate so that the surface thereof is turn up. In the transfer chamber 205, the long-chain alkyl group and the like are introduced into the conductive polymer represented by poly (phenylenevinylene) and poly (fluorene), thereby forming a film thereover using the soluble derivative solution by spin coating or ink jetting. The material used here is not limited to the high molecular compound, and as far as the material can be well deposited, it can be a low molecular organic compound, or an organic metal complex. After forming the electroluminescent layer, it is transferred to the inversion and vacuum bake chamber 202 through the transfer chamber 201a. Here, inverting and vacuum baking are carried out.

The metal formed over the electroluminescent layer is preferably formed as the same way described above. In addition, the substrate used for sealing is preferably bonded as the same way described above.

Embodiment Mode 2

A metal which serves as an electron injection electrode (for example, AlLi alloy, MgAg alloy, or the like) is formed over the substrate by vacuum vapor deposition or EB method. Next, the solution including a donor is applied in wet process. As the donor, alkylammonium ion (for example, tetraethylammonium, tetrabutylammonium, or the like), or Tetrathiafulvalene (hereinafter referred to as "TTF") are preferable. For the last, the conductive polymer including the donor is applied in wet process. As the conductive polymer, poly (aniline), poly (pyrrole) or the like is preferable.

The electroluminescent layer can be formed by vapor deposition or application in wet process. As the structure of the electroluminescent layer, the structure of the light emitting element using the known organic EL material is preferably used. As an anode of the hole injection electrode, an ITO film is preferably used. The ITO film is preferably formed by sputtering, electron beam deposition, ion plating, or the like.

Embodiment

Embodiment 1

Figure 3:
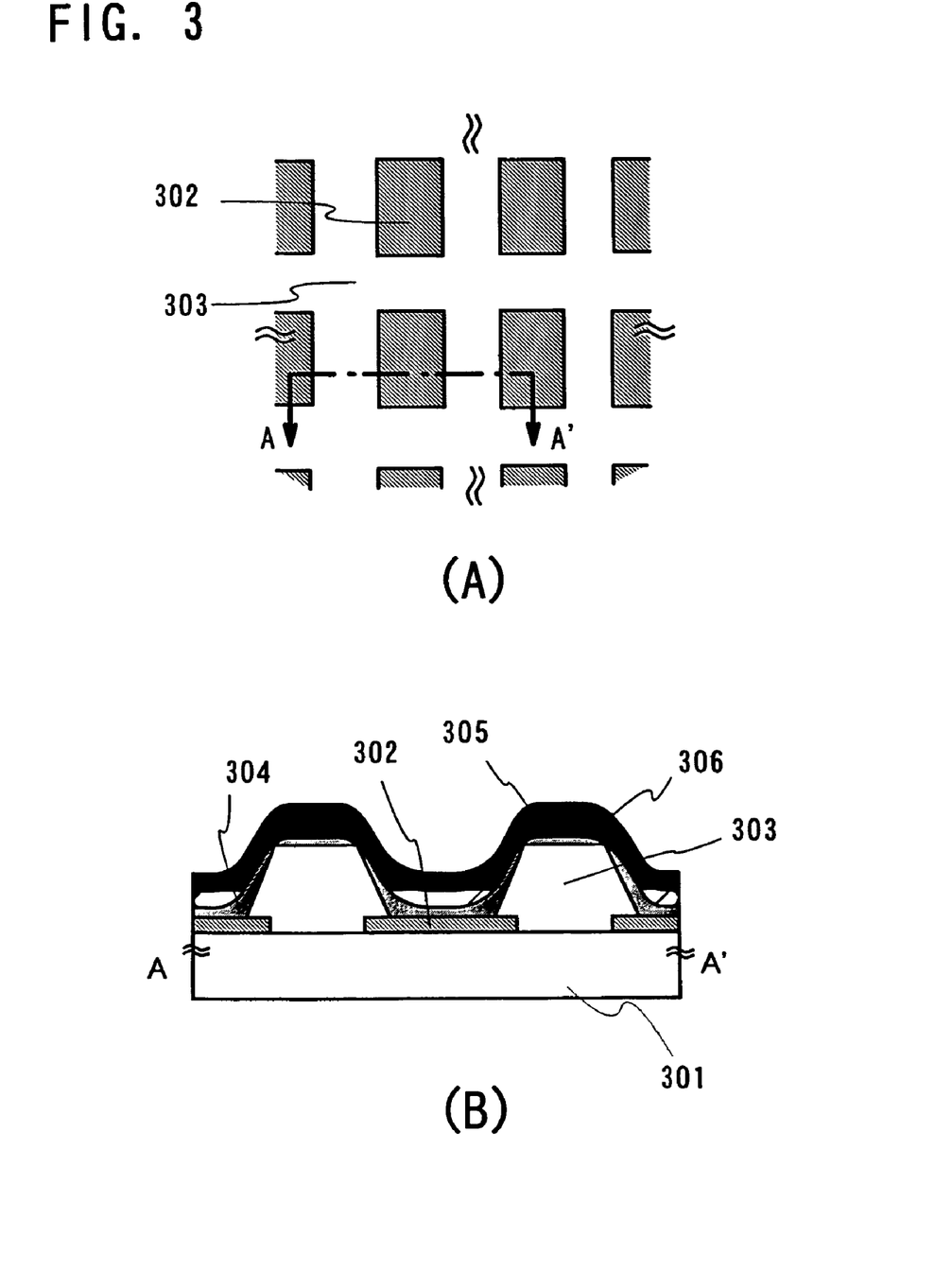
FIGS. 3(A) and 3(B) are diagrams showing constitutions of a light emitting element using an organic EL material manufactured according to the present invention in Embodiment 1.

FIG. 3(A) shows a substrate used in this embodiment. And FIG. 3(B) shows a cross sectional view of A-A' in the drawing. An insulating barrier 303 is formed by photolithography over a glass substrate 301 on which a transparent electrode 302 of ITO is patterned. The transparent electrode 302 of the ITO is a rectangle with a film thickness of 100 nm and length of 300 μm and width of 60 μm. The insulating barrier 303 is formed from acrylic resin, which has 1.5 μm height.

In order to obtain the hydrophilic property of the transparent electrode 302 of ITO and the insulating barrier 303, UV ozone rinsing is carried out. Then, 1.5 wt % poly (styrenesulfonic acid) aqueous solution is spin coated. Pure water is applied to the substrate immediately, and the substrate is spun to cut the water. Lastly, PEDOT/PSS aqueous solution is applied over the entire surface so as to obtain the film thickness of 60 nm by spin coating, prebaked at 80° C. for 10 minutes, baked at 200° C. for one hour, and then vacuum heated just before the deposition (at 170° C., heating for 30 minutes and cooling for 30 minutes). Subsequently, an electroluminescent layer 305 is formed by vacuum vapor deposition without exposing to air.

Each of an electroluminescent layer 305 and a cathode 306 are formed over an organic conductive layer 304 by vacuum vapor deposition. As the electroluminescent layer, 4,4'-bis[N-(3-methylphenyl)-N-phenyl-amino]-biphenyl (hereinafter referred to as "TPD") with a thickness of 50 nm, and tris (8-quinolinolate) aluminum (hereinafter referred to as "Alq") with a thickness of 50 nm are deposited. Lastly, AlLi alloy with a thickness of 100 nm is deposited as the cathode, thereby manufacturing a light emitting element using an organic EL material.

As described above, the organic conductive layer can be deposited uniformly by a simple method according to the manufacturing method of the present invention. Therefore, a light emitting element using an organic EL material can be manufactured with preferable yield and lower cost.

Embodiment 2

Figure 4:
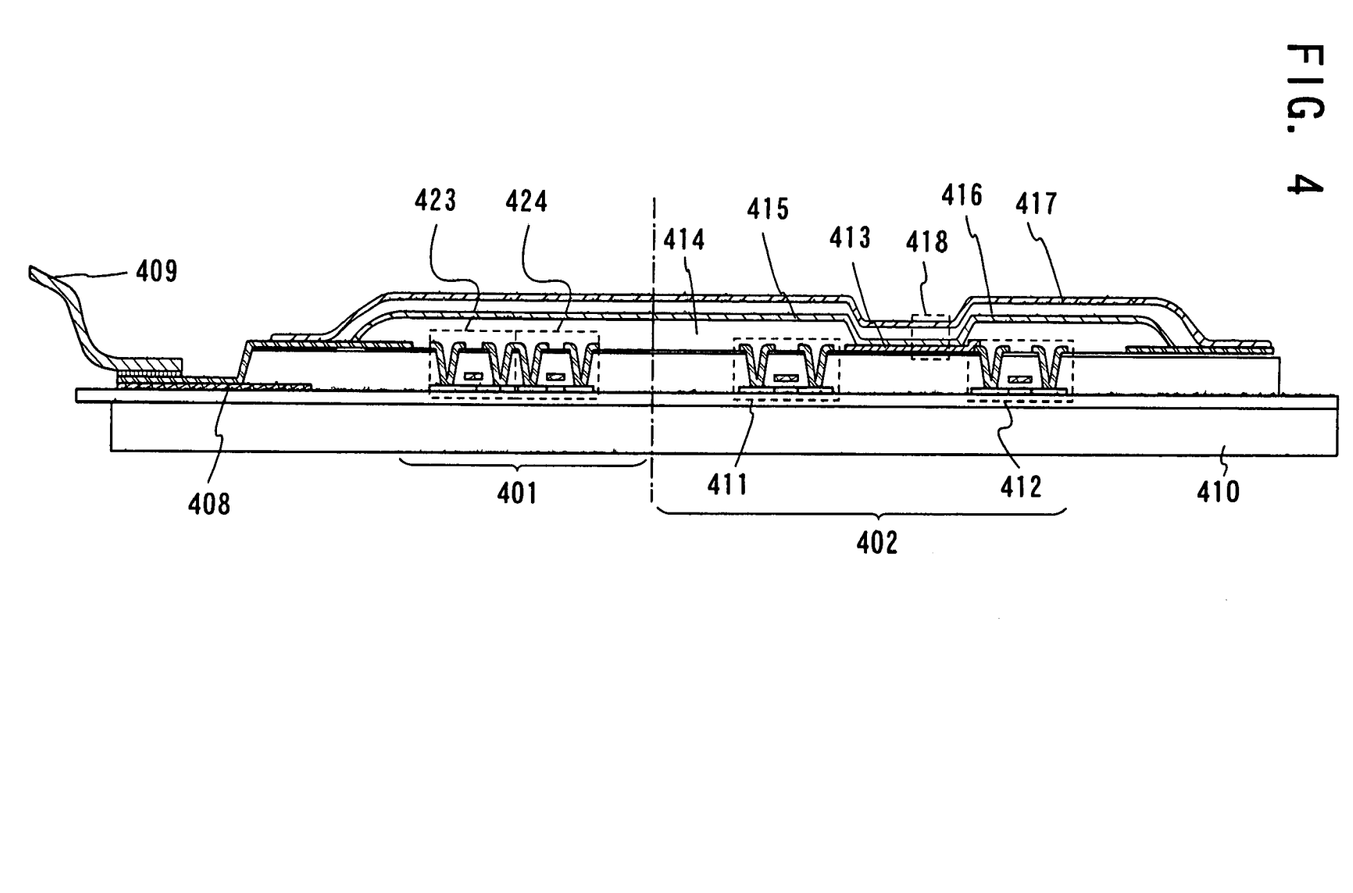
FIG. 4 is a diagram showing a constitution of a display device manufactured according to the present invention in Embodiment 2.

In this embodiment, a light emitting device comprising a pixel portion formed from a light emitting element using an organic EL material by the manufacturing method according to the present invention is described with reference to a cross sectional view in FIG. 4. A drive circuit portion and a pixel portion are formed over a substrate 410, here; a source side drive circuit 401 as the drive circuit portion and a pixel portion 402 are illustrated.

A CMOS circuit combined with an n-channel type TFT 423 and a p-channel type TFT 424 is formed in the source side drive circuit 401. Further, a TFT for forming a drive circuit may be formed of a known CMOS circuit, PMOS circuit, or NMOS circuit. In this embodiment, a driver built-in type wherein the drive circuit is formed over the substrate is illustrated, it is not necessary to be the type, and the drive circuit may be formed not over the substrate but in the exterior of the substrate.

The pixel portion 402 is formed of plural pixels including a switching TFT 411, a current control 412, and a first electrode 413 which is electrically connected to the drain of the current control TFT 412. An insulating material 414 is formed so as to cover the edge portion of the first electrode 413. The insulating material 414 is formed by using a positive type photosensitivity acrylic resin film.

In order to obtain the preferable coverage, a curved surface having curvature in the top end and the bottom end of the insulating material 414 is to be formed. For example, in the case of using the positive type photosensitivity acrylic resin as the material for the insulating material 414, it is preferable that only the top end of the insulating material 414 has a curved surface with curvature radius (0.2 μm to 3 μm). In addition, either of a negative type which becomes insoluble to the etchant by the photosensitive light or a positive type which becomes solubility to the etchant by the light can be used as the insulating material 414.

In order that the first electrode 413 and the insulating material 414 have hydrophilic property, UV ozone rinsing is carried out. After being hydrophilic, PEDOT/PSS aqueous solution is applied to the entire surface by spin coating. However, there is a case that conductive polymer including an acceptor such as PEDOT/PSS cannot be uniformly formed over the substrate only by UV treatment. Therefore, the solution or the dispersion liquid including the same substance as the acceptor is applied in wet process. Specifically, aqueous solution including poly (styrenesulfonic acid) which is an acceptor is spin coated. After spin coating, the substrate is spun while covered with pure water. Lastly, PEDOT/PSS is spin coated to form the uniform organic conductive layer. Each of an electroluminescent layer 416 and a second electrode 417 are formed over the organic conductive layer 415, thereby forming an electroluminescent element 418. Here, a material having larger work function is preferably used as a material for the first electrode 413 which serves as an anode. For example, in addition to a single layer film such as an ITO film, an indium zinc oxide (IZO) film, an titanium nitride film, a chromium film, a tungsten film, a Zn film, or a Pt film, laminated layer of films of a titanium nitride film and a film containing aluminum as its main component, or a three-laminated structure of the titanium nitride film, the film containing aluminum as its main component and titanium nitride film can be used. Further, when the laminated structure is used, the resistance as the wiring becomes lower, preferable ohmic contact can be obtained, and it can be functioned as an anode.

The electroluminescent layer 416 can be formed by vapor deposition using a vapor deposition mask, or ink jetting. Either of the low molecular material or the high molecular material can be used for the electroluminescent layer 416. Further, as the material for the electroluminescent layer 416, a single layer or laminated layer of the organic compound is generally used. However, in the present invention, composition using inorganic compound in the one part of the film comprising an organic compound may be included.

Further, a material that has smaller work function (Al, Ag, Li, Ca, or alloy material thereof such as MgAg, MgIn, AlLi, $CaF_2$, or CaN) is preferably used as the material used for the second electrode (cathode) 417 which is formed over the electroluminescent layer 416. In the case that light generated in the electroluminescent layer 416 transmits the second electrode 417, a laminated layer of a thin metal film with thin film thickness, a transparent conductive film (ITO, indium oxide-zinc oxide alloy ($In_2O_3$-ZnO), zinc oxide (ZnO), or the like is preferably used as the second electrode (cathode) 417.

As described above, an organic conductive layer can be uniformly formed with a simple method according to the manufacturing method of the present invention; thus, a light emitting element using an organic EL material can be manufactured with a preferable yield and lower cost.

INDUSTRIAL APPLICABILITY

As described above, a manufacturing method of the display device according to the present invention can be applicable for manufacturing a display device using an organic conductive layer. Further, the application range of the display device obtained by a manufacturing method of the display device of the present invention is extremely wide, and the display device can be used in various fields of electric apparatuses.

What is claimed is:

1. A method of manufacturing a display device comprising:
   forming a layer which contains a first acceptor on an electrode by applying a first liquid which contains the first acceptor onto the electrode;
   washing the layer which contains the first acceptor with water, thereby removing a first part of the layer which contains the first acceptor from a central portion of the electrode;
   wherein a second part of the layer which contains the first acceptor remains on the electrode after washing the layer which contains the first acceptor with water,
   forming a conductive layer comprising a second acceptor over the electrode and the second part of the layer which contains the first acceptor by applying a second liquid which contains the second acceptor over the electrode; and
   forming an electroluminescent layer on the conductive layer comprising the second acceptor.

2. The method according to claim 1 wherein said second acceptor is the same as the first acceptor.

3. The method according to claim 1 wherein each of said first liquid and said second liquid is an aqueous solution.

4. The method according to claim 1 wherein said electroluminescent layer comprises an organic material.

5. The method according to claim 1 wherein said display device is an active matrix type display.

6. A method of manufacturing a display device comprising:
   forming a layer which contains a first donor on an electrode by applying a first liquid which contains the first donor onto the electrode;
   washing the layer which contains the first donor with water, thereby removing a first part of the layer which contains the first donor from a central portion of the electrode;
   wherein a second part of the layer which contains the first donor remains on the electrode after washing the layer which contains the first donor with water,
   forming a conductive layer comprising a second donor over the electrode and the second part of the layer which contains the first donor by applying a second liquid which contains the second donor over the electrode; and
   forming an electroluminescent layer on the conductive layer comprising the second donor.

7. The method according to claim 6 wherein said second donor is the same as the first donor.

8. The method according to claim 6 wherein each of said first liquid and said second liquid is an aqueous solution.

9. The method according to claim 6 wherein said electroluminescent layer comprises an organic material.

10. The method according to claim 6 wherein said display device is an active matrix type display.

11. A method of manufacturing a display device comprising:
    covering only a part of an electrode with an insulating material;
    forming a layer which contains a first acceptor on an exposed portion of the electrode and a surface of the insulating material by applying a first liquid which contains the first acceptor onto the electrode;
    washing the layer which contains the first acceptor with water, thereby removing a first part of the layer which contains the first acceptor from a central portion of the electrode and from a top portion of the insulating material;
    wherein a second part of the layer which contains the first acceptor remains on the corner of the electrode and the insulating material after washing the layer which contains the first acceptor with water,
    forming a conductive layer comprising a second acceptor over the electrode and the second part of the layer which contains the first acceptor by applying a second liquid which contains the second acceptor over the electrode; and
    forming an electroluminescent layer on the conductive layer comprising the second acceptor.

12. The method according to claim 11 wherein said second acceptor is the same as the first acceptor.

13. The method according to claim 11 wherein each of said first liquid and said second liquid is an aqueous solution.

14. The method according to claim 11 wherein said electroluminescent layer comprises an organic material.

15. The method according to claim 11 wherein said display device is an active matrix type display.

16. A method of manufacturing a display device comprising:
    covering only a part of an electrode with an insulating material;
    forming a layer which contains a first donor on an exposed portion of the electrode and a surface of the insulating material by applying a first liquid which contains the first donor onto the electrode;
    washing the layer which contains the first donor with water, thereby removing a first part of the layer which contains the first donor from a central portion of the electrode and from a top portion of the insulating material;
    wherein a second part of the layer which contains the first donor remains on the corner of the electrode and the insulating material after washing the layer which contains the first donor with water,
    forming a conductive layer comprising a second donor over the electrode and the second part of the layer which contains the first donor by applying a second liquid which contains the second donor over the electrode; and
    forming an electroluminescent layer on the conductive layer comprising the second donor.

17. The method according to claim 16 wherein said second donor is the same as the first donor.

18. The method according to claim 16 wherein each of said first liquid and said second liquid is an aqueous solution.

19. The method according to claim 16 wherein said electroluminescent layer comprises an organic material.

20. The method according to claim 16 wherein said display device is an active matrix type display.

21. A method of manufacturing a display device comprising:
    covering only a part of an electrode with an insulating material;
    forming a layer which contains one of an acceptor and a donor on an exposed portion of the electrode and a surface of the insulating material by applying a first liquid which contains said one of the acceptor and the donor onto the electrode;
    washing the layer which contains said one of the acceptor and the donor with water, thereby removing a first part of the layer which contains said one of the acceptor and the donor from a central portion of the electrode and from a top portion of the insulating material;
    wherein a second part of the layer which contains said one of the acceptor and the donor remains on the corner of the electrode and the insulating material after washing the layer which contains said one of the acceptor and the donor, forming a conductive layer comprising said one of the acceptor and the donor over the electrode and the second part of the layer which contains said one of the acceptor and the donor by applying a second liquid which contains said one of the acceptor and the donor over the electrode; and forming an electroluminescent layer on the conductive layer comprising said one of the acceptor and the donor.

22. The method according to claim 21 wherein each of said first liquid and said second liquid is an aqueous solution.

23. The method according to claim 21 wherein said electroluminescent layer comprises an organic material.

24. The method according to claim 21 wherein said display device is an active matrix type display.

* * * * *